(12) United States Patent
Hunt et al.

(10) Patent No.: US 6,368,665 B1
(45) Date of Patent: Apr. 9, 2002

(54) APPARATUS AND PROCESS FOR CONTROLLED ATMOSPHERE CHEMICAL VAPOR DEPOSITION

(75) Inventors: Andrew T. Hunt, Atlanta; Subramaniam Shanmugham, Doraville; William D. Danielson, Decatur; Henry A. Luten, Doraville; Tzyy Jiuan Hwang, Alpharetta; Girish Deshpande, Atlanta, all of GA (US)

(73) Assignee: MicroCoating Technologies, Inc., Chamblee, GA (US)

( * ) Notice: Subject to any disclaimer, the term of this patent is extended or adjusted under 35 U.S.C. 154(b) by 0 days.

(21) Appl. No.: 09/067,975

(22) Filed: Apr. 29, 1998

(51) Int. Cl.⁷ .......................... C23C 16/00; C23C 16/48; B05D 3/00; H05H 1/24
(52) U.S. Cl. .................... 427/250; 427/255; 427/255.1; 427/255.6; 427/561; 427/569; 427/576; 427/585
(58) Field of Search ................ 427/255.1, 255.6, 427/255.25, 255.28, 543, 561–562, 582–585, 564, 569, 573, 575, 576, 587, 591–593

(56) References Cited

U.S. PATENT DOCUMENTS

| | | | |
|---|---|---|---|
| 3,808,576 A | 4/1974 | Castonguay et al. | 338/309 |
| 4,033,286 A | * 7/1977 | Chern et al. | 118/49 |
| 4,808,967 A | 2/1989 | Rice et al. | 338/309 |
| 5,077,100 A | * 12/1991 | Miracky | 427/53.1 |
| 5,652,021 A | 7/1997 | Hunt et al. | 427/248.1 |
| 5,820,942 A | * 10/1998 | Singh et al. | 427/508 |
| 5,835,678 A | * 11/1998 | Li et al. | 392/401 |
| 5,906,684 A | * 5/1999 | Tamura et al. | 118/728 |
| 5,910,342 A | * 6/1999 | Hirooka et al. | 427/573 |
| 5,997,956 A | * 12/1999 | Hunt et al. | 427/450 |

* cited by examiner

*Primary Examiner*—Paul Thibodeau
*Assistant Examiner*—Sheeba Ahmed
(74) *Attorney, Agent, or Firm*—Wayne E. Nacker; Alfred H. Muratori; Darryl P. Frickey

(57) ABSTRACT

An improved chemical vapor deposition apparatus and procedure is disclosed. The technique provides improved shielding of the reaction and deposition zones involved in providing CVD coatings, whereby coatings can be produced, at atmospheric pressure, of materials which are sensitive to components in the atmosphere on substrates which are sensitive to high temperatures and which are too large, or inconvenient, to process in vacuum or similar chambers. The improved technique can be used with various energy sources and is particularly compatible with Combustion Chemical Vapor Deposition (CCVD) techniques.

66 Claims, 4 Drawing Sheets

FIG.3

APPARATUS AND PROCESS FOR CONTROLLED ATMOSPHERE CHEMICAL VAPOR DEPOSITION

This application is directed to an apparatus and process which can be used in producing at least some of the products described in copending patent applications, "The Deposition of Resistor Materials Directly on Insulating Substrates", Ser. No. 09/069,679, now U.S. Pat. No. 6,210,592; "Resistors for Electronic Packaging", Ser. No. 09/069,427, now U.S. Pat. No. 6,208,234; and "Precursor Solution Compositions for Electronic Devices Using CCVD", Ser. No. 09/069,640, now U.S. Pat. No. 6,193,911; and "Controlled Atmosphere Flame For CCVD Process", Ser. No. 09/067,975, pending filed on or about the same day as this application, the contents of which applications are incorporated by reference herein.

BACKGROUND OF THE INVENTION

1. Field of the Invention

This invention relates to chemical vapor deposition (CVD) wherein coatings are applied to substrates by reacting a coating precursor in a reaction zone to produce a reaction product of the coating precursor which immediately contacts a substrate forming a coating thereon. The invention is particularly directed to improvements in CVD apparatus and processes which permit the production of high quality thin film coatings on temperature sensitive substrates without the need for creating such coatings in a vacuum or similar chamber. In preferred embodiments the invention enables the production of thin film coatings on temperature sensitive substrates at atmospheric pressure, thereby enabling the production of high quality thin film coatings on large substrates which could not be coated by prior techniques requiring vacuum processing.

2. Description of Related Art

Chemical vapor deposition (CVD) is a well known technique for depositing coatings by providing a gaseous reactant material which reacts adjacent to, or on, a substrate surface to produce a solid deposit or coating on that surface. A recent development of the CVD process, referred to as Combustion Chemical Vapor Deposition, or CCVD, is described in U.S. Pat. No. 5,652,021, and is incorporated by reference herein. The reactants in that process are fed dissolved or suspended in a liquid, which can be a fuel, and which is sprayed into a reaction zone from a nozzle using an oxidizing gas as the propellant. The sprayed mixture is either ignited producing a flame, or is introduced into a flame, while a substrate is maintained near the flame's end. The reactants, which vaporize either prior to or in the flame, produce a deposited film on the substrate. The patent describes a number of prior CVD processes, including some which feed gaseous or vaporized reactants, some which use a sprayed or atomized solution, and some which feed reactive solid powders. The patent also describes a number of alternative coating techniques including spray pyrolysis wherein solutions are sprayed onto a heated substrate where they pyrolyze to form a coating, and techniques wherein a solid coating material is either melted or vaporized in a flame, plasma or other heating device and splattered or condensed on a substrate to form a coating.

One embodiment described in the patent involves providing a coating which requires a reducing atmosphere on a substrate deployed in the reducing region between the inner and outer flames produced by a Smithell separator. The techniques described in this patent have been generally employed to successfully provide coatings of oxides and a few relatively oxidation resistant metals. However, the production of quality coatings of many metals and other relatively oxidation susceptible materials has been inconsistent prior to the development of the present invention.

While a number of materials can be deposited from a reducing flame, there are numerous materials which can only be deposited in the absence, or near absence, of oxygen. Most nitrides, carbides and borides require an oxygen free environment, not only free of free oxygen, but also free of combined oxygen in such as water and carbon oxides. Those elements which are more susceptible to oxidation, such as aluminum, silicon and titanium, also require an oxygen free atmosphere. Embodiments of the invention disclosed herein enable the deposition of such oxygen sensitive materials.

Moreover, there is interest in developing techniques for forming thin coatings of low dielectric constant materials as interlayers on temperature sensitive substrates, such as electronic chips, condensers and microcircuit laminates. Polymers, particularly polyfluorocarbons, such as polytetrafluoroethylene, and polyimides, are of particular interest because of their low dielectric constant and high thermal stability. Coatings of these and other organic materials are also potentially useful for corrosion, optical, thermal, cosmetic, wear and release property applications. The inventive process enables coatings of these polymers to be applied from their monomeric or low molecular weight precursors onto substrates which are temperature and/or oxidation sensitive.

A further improvement of the CCVD process is described in U.S. patent application Ser. No. 08/691,853, filed Aug. 2, 1996, and which is hereby incorporated by reference. This application describes a CCVD process wherein the coating precursor reactant is provided in admixture or solution in a liquid feed stream which is pressurized to near its critical pressure and heated to near its supercritical temperature before being directed through a nozzle or other restriction. The near-critical conditions of the liquid result in the feed stream being very finely atomized or vaporized as it is leaves the nozzle to enter a zone where the coating precursor reacts and either deposits a coating on a substrate or is recovered as a finely divided powder.

SUMMARY OF THE INVENTION

This invention provides an apparatus and method for chemical vapor deposition wherein the atmosphere in a controlled atmosphere zone is established by carefully controlling and shielding the materials fed to form the coating and by causing the gases removed from the controlled atmosphere zone to pass through a barrier zone wherein they flow away from said controlled atmosphere zone at an average velocity greater than 50 feet per minute, and preferably greater than 100 feet per minute. The controlled atmosphere zone is inclusive of the reaction zone, wherein the coating precursor is reacted, and the deposition zone, wherein the reaction product of the coating precursor deposits a coating on a substrate. The rapid gas flow through the barrier zone essentially precludes the migration of gases from the ambient atmosphere to the deposition zone where they could react with the coating, the materials from which the coating is derived, or the substrate.

Careful control of the materials used to form the coating can be provided by feeding the coating precursors in a fixed proportion in a liquid media. The liquid media is atomized as it is fed to a reaction zone wherein the liquid media is vaporized and the coating precursors react to form reacted coating precursors. Alternatively, the coating precursor(s) can be fed as a gas, either as the pure coating precursor or as a mixture in a carrier gas. The reacted coating precursors can be composed of partially, fully and/or fractionally reacted components, which flow to the substrate. The reacted coating precursors contact and deposit the coating on the surface of the substrate in the deposition zone. A curtain of flowing inert gases may be provided around the reaction zone to shield the reactive coating materials plasma in that zone from contamination with the materials used in the surrounding apparatus or with the components of the ambient atmosphere.

The vaporization of the liquid media and reaction of the coating precursors in the reaction zone requires an input of energy. Depending on the reactivity of the coating material and the substrate, the required energy can be provided from various sources, such as combustion, electrical resistance heating, induction heating, microwave heating, RF heating, hot surface heating, laser heating and/or mixing with a remotely heated gas.

For coating applications which do not require an oxygen free environment, an embodiment of the present inventive apparatus which incorporates the recently developed Combustion Chemical Vapor Deposition (CCVD) process, as described in the incorporated U.S. Pat. No. 5,652,021, is particularly advantageous. We refer to this process as Controlled Atmosphere Combustion Chemical Vapor Deposition (CACCVD). This technique provides a relatively high rate of energy input, enabling high rates of coating deposition. In some preferred cases, the fluid media and/or a secondary gas used to atomize the fluid media can be a combustible fuel which also serves as an energy source. Particularly important is the capability of CACCVD to form high quality adherent thin film deposits at or about atmospheric pressure, thereby avoiding the need for elaborate vacuum or similar isolation housings. For these reasons, in many cases, CACCVD thin film coatings can be applied in situ, or "in the field", where the substrate is located.

Combustion chemical vapor deposition (CCVD) is not suitable for those coating applications wherein the coating, and/or the substrate, require an oxygen free environment. For such applications, embodiments of the present invention employing non-combustion energy sources such as hot gases, heated tubes, radiant energy, microwave and energized photons, as with infrared or laser sources, are suitable. In these applications it is important that all of the liquids and gases provided to the reaction and deposition zones be oxygen free. The coating precursors can be fed in solution or suspension in liquids. Liquid ammonia and propane are suitable for the deposit of nitrides or carbides, respectively. The use of these non-combustion energy sources in a controlled atmosphere chemical vapor deposition system which forms deposits at or above atmospheric pressure is a particularly advantageous and unique embodiment of this invention. The use of the non-combustion energy sources in a CVD system which provides enhanced atomization by the rapid release through a nozzle, or similar restriction, of the liquid coating precursor from near critical temperature and pressure conditions is a further uniquely advantageous embodiment.

The embodiments of the invention which use non-combustion energy sources are also particularly suitable for applying organic coatings. These coatings generally require less energy input than is usually involved with inorganic coatings. Moreover, organic materials generally have relatively low to moderate decomposition temperatures requiring careful control over the energy input and achieved temperatures. Accordingly, embodiments of the invention which incorporate such energy sources as mixing with remotely heated liquids or gases, hot-surface heating, electrical resistance heating, induction heating, and heating methods employing RF, infrared or microwave energy, are well suited for depositing organic coatings.

Since the inventive process and apparatus provide a controlled atmosphere zone which is capable of movement relative to the substrate, it enables the production of coatings on substrates which may be larger than the controlled atmosphere zone and, therefore, larger than could otherwise be processed by conventional vacuum chamber deposition techniques.

A further advantage of the present system is its ability to coat substrates without needing additional energy supplied to the substrate. Accordingly, this system allows substrates to be coated which previously could not withstand the temperatures to which substrates were subjected by most previous systems. For instance, nickel coatings can be provided on polyimide sheet substrates without causing deformation of the substrate. Previously, atmospheric pressure deposition techniques were unable to provide chemical vapor deposition of metallic nickel because of its strong affinity to oxygen, while vacuum processing of polymeric sheet substrates, such as polyimide sheets, was problematical due to its causing of outgassing of water and organic materials, and such substrates tendency toward dimensional instability when subjected to heat and vacuum.

DETAILED DESCRIPTION OF THE INVENTION

Figure 1:
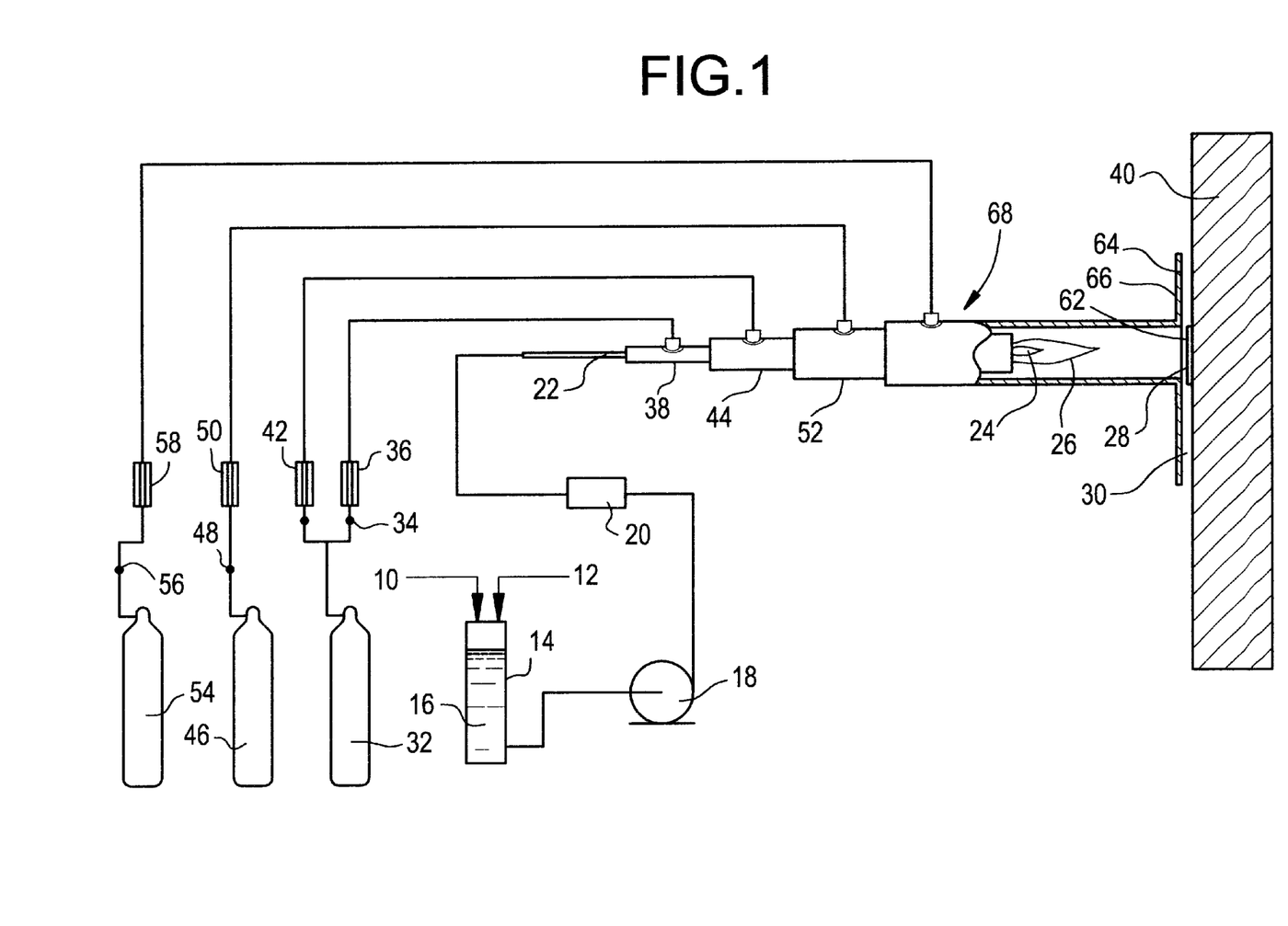
FIG. 1 is a schematic view, partially in section, of an apparatus for applying coatings in accord with the present invention.
Figure 2:
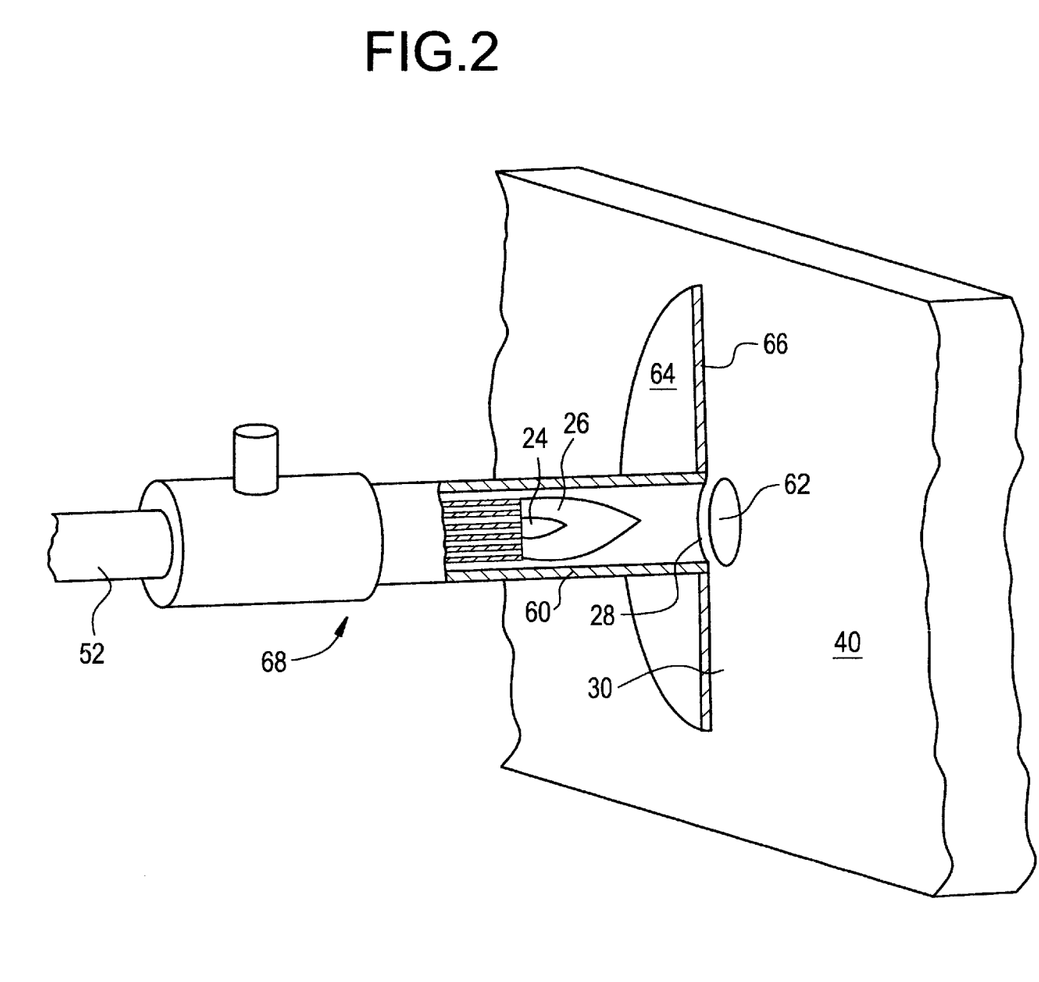
FIG. 2 is a close-up perspective view, partially in section, of a portion of the coating head used in the apparatus of FIG. 1.

A Controlled Atmosphere Combustion Chemical Vapor Deposition (CACCVD) apparatus according to the present invention is illustrated in FIGS. 1 and 2. A coating precursor 10 is mixed with a liquid media 12 in a forming zone 14, comprising a mixing or holding tank 16. The precursor 10 and liquid media 12 are formed into a flowing stream which is pressurized by pump 18, filtered by filter 20 and fed through conduit 22 to an atomization zone 24, from which it flows successively through reaction zone 26, deposition zone 28 and barrier zone 30. The reaction zone 26 and deposition zone 28 are both included in a controlled atmosphere zone.

The flowing stream is atomized as it passes into the atomization zone 24. Atomization can be accomplished by recognized techniques for atomizing a flowing liquid stream. In the illustrated apparatus, atomization is effected by discharging a high velocity atomizing gas stream surrounding and directly adjacent the flowing stream as it discharges from conduit 22. The atomizing gas stream is provided from a gas cylinder or other source of high pressure gas. In the illustrated embodiment, high pressure hydrogen ($H_2$) is used both as an atomizing gas and as a fuel. The atomizing gas is fed from hydrogen gas cylinder 32, through regulating valve 34 and flowmeter 36 into conduit 38. Conduit 38 extends concentrically with conduit 22 to the atomization zone where both conduits end allowing the high-velocity hydrogen atomizing gas to contact the flowing liquid stream, thereby causing it to atomize into a stream of fine particles suspended in the surrounding gas/vapors. This stream flows into the reaction zone 26 wherein the liquid media vaporizes and the coating precursor reacts to form a reacted coating precursor, which can involve dissociation of the coating precursor into ions of its components resulting in a flowing stream of ionic particles, or plasma. The flowing stream is then directed to contact the substrate 40 thereby depositing the coating thereon in the deposition zone 28.

The flowing stream may be atomized by injecting the atomizing gas stream directly at the stream of liquid media/coating precursor as it exits conduit 22. Alternatively, atomization can be accomplished by directing ultrasonic or similar energy at the liquid stream as it exits conduit 22. A further preferred atomization technique which involves feeding the liquid media/coating precursor at a temperature within 50° C. of its critical temperature and a pressure above its liquidus or critical pressure to a restriction, such as through a hollow needle with a restricted outlet or a nozzle, from which it discharges into a lower pressure zone is described in the incorporated patent application, Ser. No. 08/691,853. The rapid pressure release of the highly energetic liquid media/coating precursor results in its fine atomization and vaporization.

The vaporization of the liquid media and reaction of the coating precursor require substantial energy input to the flowing stream before it leaves the reaction zone. This energy input can occur as it passes through the conduit 22, and/or in the atomization and reaction zones. The energy input can be accomplished by a variety of known heating techniques, such as fuel combustion, electrical resistance heating, microwave or RF heating, induction heating, radiant heating, mixing the flowing stream with a remotely heated liquid or gas, photonic heating such as with a laser, heat exchange through a hot surface, etc. In the illustrated preferred embodiment, the energy input is accomplished by the combustion of a fuel and an oxidizer in direct contact with the flowing stream as it passes through the reaction zone. This relatively new technique, referred to as Combustion Chemical Vapor Deposition (CCVD), is more fully described in the incorporated U.S. Pat. No. 5,652,021. In the illustrated embodiment, the fuel, hydrogen, is fed from hydrogen gas cylinder 32, through a regulating valve, flowmeter 42 and into conduit 44. The oxidizer, oxygen, is fed from oxygen gas cylinder 46, through regulating valve 48 and flowmeter 50 to conduit 52. Conduit 52 extends about and concentric with conduit 44, which extends with and concentrically about conduits 22 and 38. Upon exiting their respective conduits, the hydrogen and oxygen combust creating combustion products which mix with the atomized liquid media and coating precursor in the reaction zone 26, thereby heating and causing vaporization of the liquid media and reaction of the coating precursor.

A curtain of a flowing inert gas provided around at least the initial portion of the reaction zone isolates the reactive gases from the materials present in the apparatus located in proximity to the reaction zone. An inert gas, such as argon, is fed from inert gas cylinder 54, through regulating valve 56 and flowmeter 58 to conduit 60. Conduit 60 extends about and concentric with conduit 52. Conduit 60 extends beyond the end of the other conduits 22, 38, 44 and 52, extending close to the substrate whereby it functions with the substrate 40 to define a deposition zone 28 where coating 62 is deposited on the substrate generally in the shape of the cross-section of conduit 60. As the inert gas flows past the end of oxygen conduit 52, it initially forms a flowing curtain which extends about the reaction zone, shielding the reactive components therein from conduit 60. As it progresses down the conduit 60, the inert gas mixes with the gases/plasma from the reaction zone and becomes part of the flowing stream directed to the deposition zone 28.

An ignition source is needed to initially ignite the hydrogen and oxygen. A separate manually manipulated lighting or ignition device is sufficient for many applications, however the use of such may require a temporary reduction in the flow of inert gas until a stable flame front is established. In some applications, the total flow of gas may be too great to establish an unassisted stable flame front. It then is necessary to provide an ignition device capable of continuously or semi-continuously igniting the combustible gases as they enter the reaction zone. A pilot flame or a spark producing device are exemplary ignition sources which may be employed.

In the deposition zone 28, the reacted coating precursor deposits coating 62 on a portion of the surface of the substrate 40. The remainder of the flowing stream flows as exhaust gas from the deposition zone through a barrier zone 30 to discharge into the surrounding, or ambient, atmosphere. The barrier zone 30 functions to prevent contamination of a controlled atmosphere zone by components of the ambient atmosphere. The controlled atmosphere zone includes the reaction zone, the deposition zone and any additional space through which the flowing stream may have access after passing from the deposition zone 28 and prior to passing through the barrier zone 30. The high velocity of the flowing stream as it passes through the barrier zone 30 is a characteristic feature of this zone. By requiring that the flowing stream achieve a velocity of at least fifty feet per minute as it passes through the barrier zone, the possibility of contamination of the controlled atmosphere zone by components of the ambient atmosphere is substantially eliminated in most coating applications. By requiring that the flowing stream achieve a velocity of at least one hundred feet per minute the possibility of ambient atmosphere contamination of the controlled atmosphere zone is essentially eliminated in those coating operations which are more highly contamination sensitive, such as in the production of nitride or carbide coatings.

In the embodiment of FIG. 1, a collar 64 is attached to and extends perpendicularly outward from the end of conduit 60 adjacent deposition zone 28. The barrier zone 30 is adjacent the collar and a portion of the substrate surface and is defined by the is clearance provided between the collar 64 and the substrate 40. The collar is shaped to provide a conforming surface 66 capable of being deployed close to the surface of the substrate whereby a relatively small clearance is provided for the exhaust of gases passing from the deposition zone to the ambient atmosphere. The clearance established between the conforming surface 64 of the collar and the substrate is sufficiently small that the exhaust gases achieve the velocity required in the barrier zone for at least a portion of their passage between the collar and the substrate. To this end, the conforming surface 64 of the collar 62 is shaped to lie essentially parallel to the surface of the substrate 40. When the surface of the substrate 40 is essentially planar, as it is in the illustrated embodiment, the conforming surface of the substrate is also substantially planar.

Edge effects, such as elevated temperatures and residual reactive components, which occur adjacent the end of the conduit 60 can extend the deposition zone beyond the area of the substrate located directly in front of the end of conduit 60. The collar 64 should extend outward from its joinder to the conduit 60 a sufficient distance to preclude the back-mixing of ambient gases into the deposition zone due to a possible Venturi effect, and to assure that the entire area of the deposition zone, as it is extended by the previously noted edge effects, is protected from the backflow of ambient gases by the "wind" of high velocity exhaust gases sweeping through the area between the collar and the substrate. The extended collar assures that contamination is prevented throughout the controlled atmosphere zone including the entire extended deposition zone. The diameter of the collar should be at least twice the internal diameter of conduit 60, and preferably, should be at least five times the internal diameter of conduit 60. The internal diameter of conduit 60 typically is in the range of 10 to 30 millimeters, and preferably is between 12 and 20 millimeters.

In operation, the collar 64 is located substantially parallel to the surface of the substrate 40 and at a distance therefrom of 1 centimeter or less. Preferably, the facing surfaces of the collar and the substrate are between 2 and 5 millimeters apart. Spacing devices, such as three fixed or adjustable pins (not shown), may be provided on the collar to assist in maintaining the proper distance between the collar and the substrate.

The embodiment illustrated in FIG. 1 is particularly advantageous for applying coatings to substrates which are too large, or for which it is not convenient, to be treated in a specially controlled environment such as a vacuum chamber or a clean room. The illustrated coating technique is advantageous because (a) it can be applied to substrates which are larger than its controlled atmosphere zone, and (b) because it can be accomplished under atmospheric pressure conditions and at more convenient "in the field" locations. The series of concentric conduits 22, 38, 44, 52 and 60 form a coating head 68 which can be supplied by relatively small flexible tubes and can be sufficiently small to be portable. Adding energy to the coating precursor by combustion of a fuel or by providing heat generated by electrical resistance are compatible with a relatively small, portable coating head. Large substrates can be coated either by having the coating head traverse the substrate repeatedly in a raster or similar predetermined pattern, or by traversing the substrate with an array of coating heads arranged to cumulatively provide a uniform coating, or by rastering an array of coating heads. In addition to permitting the thin film coating of articles which previously were too large to be coated, this technique permits the coating of larger units of those substrates which previously were coated under vacuum conditions. Manufacturing economies can be achieved by coating larger units of these substrates, especially when mass production of the substrates is involved.

The embodiment illustrated in FIGS. 1 and 2 is also particularly suitable for the production of coatings which are oxidation sensitive, such as most metal coatings. To provide such coatings the fuel is fed through conduit 44 in proximity to the atomized liquid media and coating precursor, while the oxidizer is fed through conduit 52. The atomizing gas fed through conduit 38 and or the liquid media fed through conduit 22 can be materials having fuel value, they can be materials which react with the coating precursor or they can be inert materials. When the produced coatings or coating precursor materials are oxygen sensitive, a reducing atmosphere is maintained in the reaction and deposition zones by assuring that the total amount of oxidizer fed is restricted to an amount less than that required to fully combust the fuel provided to the reaction zone, i.e. less than a stoichiometric amount of oxidizer is provided. Generally, the fuel excess is limited so as to limit any flame zone which develops when the residual hot gases eventually mix with atmospheric oxygen. When the produced coatings and the precursor materials are oxygen tolerant or enhanced by the presence of oxygen, such as in the production of most of the oxide coatings, an oxidizing or neutral atmosphere may be provided in the reaction and deposition zones by feeding a stoichiometric or excess amount of oxidizer. Further, with oxygen tolerant reagents and products, the oxidizer can be fed through the inner conduit 44 while fuel is fed through outer conduit 52.

The inert gas supplied through conduit 60 must be sufficient to shield the inside surface of the conduit from the reactive gases produced in the reaction zone, and it must be sufficient, when added with the other gases exiting the deposition zone, to provide the gas velocity required in the barrier zone.

The energy input can be accomplished by mechanisms other than the combustion method illustrated in FIGS. 1 and 2. For instance, it could be accomplished by mixing the liquid media/coating precursor with a preheated fluid, such as an inert gas preheated to a temperature in excess of 200° C. It should be apparent that not all of the conduits 22, 38, 44, 52 and 60 are required when the energy input is accomplished by methods other than combustion. Usually one or both of conduits 44 and 52 are omitted when the energy input is provided by one of the non-combustion techniques.

The porosity or density of the deposited coating can be modified by varying the distance between the flame and the deposition zone at the substrate's surface. Shortening of this distance provides an increased coating density, while increasing the distance provides a more porous coating. In the illustrated CACCVD technique the reaction zone is generally coextensive with the flame produced by the burning fuel. Of course, the flame zone and the substrate must be maintained sufficiently far apart that the substrate is not damaged by the higher temperatures which would result when the flame zone more closely approaches the substrate surface. While substrate temperature sensitivity varies from one substrate material to the next, the temperature in the deposition zone at the substrate surface, typically, is at least 600° C. cooler than the maximum flame temperature.

When some of the non-combustion methods are used to supply the energy input, the maximum temperatures present in the reaction zone are substantially lower than those present when a fuel is combusted in the reaction zone. In such cases, such as when the principal energy input is a preheated fluid which is mixed with the flowing stream in, or before it reaches, the reaction zone, the coating properties can be adjusted by varying the distance between the reaction zone and the substrate surface with less concern for overheating the substrate. In some cases the denser coating resulting from minimizing the distance between the reaction zone and the substrate makes it desirable to provide the reaction zone directly adjacent the substrate. Accordingly, the terms reaction zone and deposition zone are useful in defining functional regions of the apparatus, but are not intended to define mutually exclusive regions, i.e. in some applications reaction of the coating precursor may occur in the deposition zone at the substrate surface.

The lower maximum temperatures resulting when the principal energy input is other than a combustion flame enables the use of temperature sensitive coating materials, such as some organic materials. In particular, polymers may be deposited as protective coatings, as anti-stick coatings or as dielectric interlevel materials in capacitors, integrated circuits or microprocessors. For instance, a polyimide coating could be provided from its polyamic acid precursor. Similarly, polytetrafloroethylene coatings could be provided from low molecular weight precursors.

The energy input to the flowing stream prior to its leaving the reaction zone generally negates the need to provide energy to the deposition zone by heating the substrate, as is often required in other coating techniques. In the present deposition system, the substrate generally acts as a heat sink cooling the gases present in the deposition zone, rather than heating them. Accordingly, the temperatures to which the substrates are subjected are substantially less than are encountered in systems which require that energy be transmitted to the deposition zone through the substrate. Therefore, the inventive coating process can be applied to many temperature sensitive substrate materials which previously could not be coated by those techniques which involved transferring heat to the deposition zone through the substrate. Moreover, the controlled atmosphere zone extending over that portion of the substrate which is at an elevated temperature protects the substrate to the same extent it protects the coating material, thereby enabling the coating of contamination sensitive substrates, such as oxidation sensitive substrates.

Figure 3:
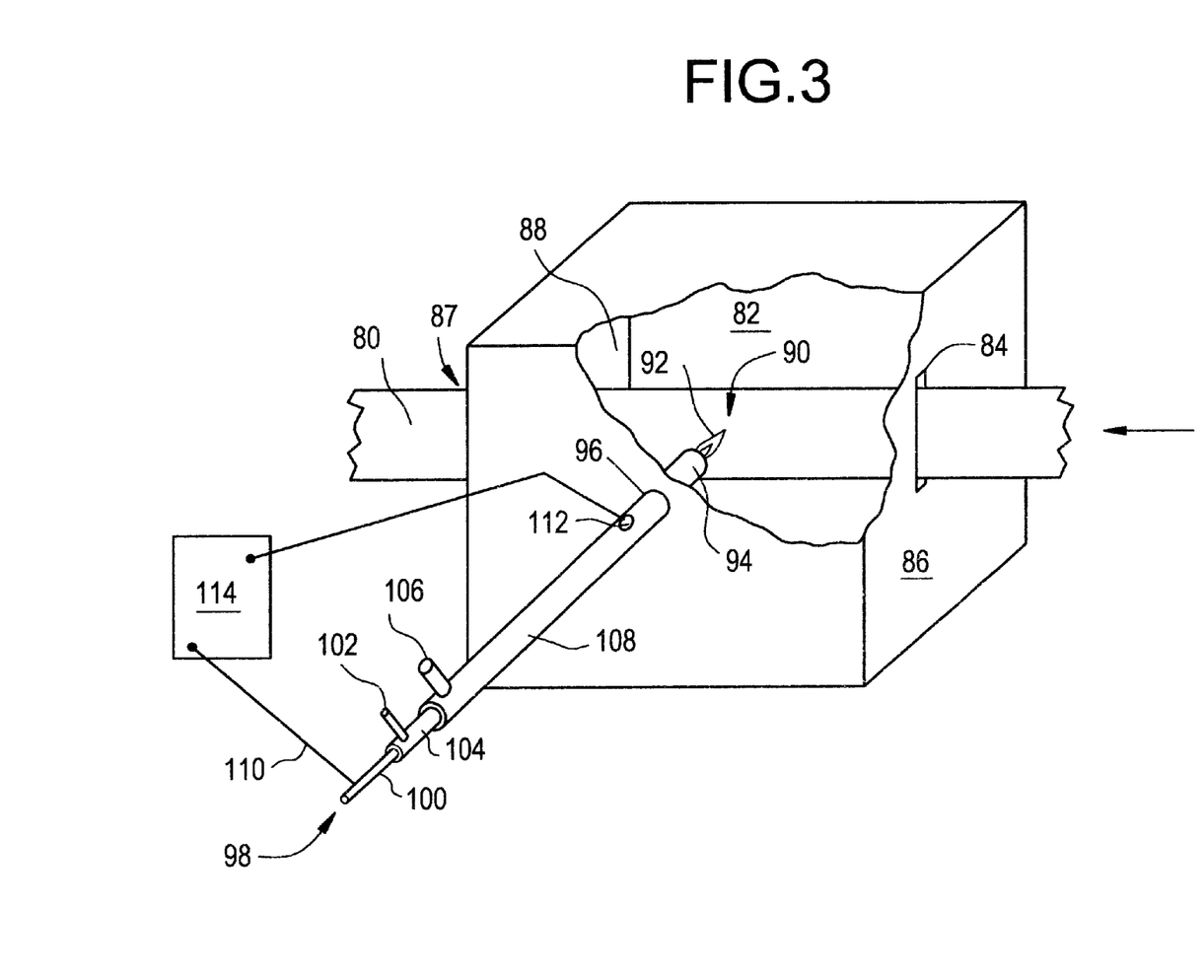
FIG. 3 is a schematic view, partially in section, of a further embodiment of the present invention.

Another embodiment of the invention is schematically illustrated in FIG. 3. An elongated substrate strip 80 is semi-continuously passed through chamber 82 by feeding it through a port 84 in one of the chamber's side walls 86 and removing it through a similar port 87 (not visible) in the chamber's opposite wall 88. The interior of the chamber 82 defines a controlled atmosphere zone which contains a reaction zone 92 and a deposition zone 90. The substrate strip 80 passes through the deposition zone 90 which is in flow communication with the reaction zone 92. The reaction zone 92 is established by reactive components fed thereto from a coating head 94 extending into the coating chamber 82 through a gas tight seal 96. The coating head is fed with a coating precursor in a fluid media 98 through conduit 100. A gas 102, for atomizing the liquid media and/or for reacting with the coating precursor, is fed through conduit 104. An inert gas 106 is fed through conduit 108. Terminals 110 and 112 spaced along conduit 100 are connected to an electrical source 114. Energy is fed to the liquid medium/coating precursor from the heat produced in conduit 100 by electricity passed between terminals 96, 98, being transferred to the liquid medium/coating precursor as it flows through the conduit. Some of the heat values are also transferred from conduit 100 to the gas 102 flowing along its exterior surface, and through the gas 102, ultimately to the reaction zone.

Some or all of the energy input required in this embodiment could be supplied by a combustion technique or by another of the non-combustion energy input techniques mentioned in regard to the embodiment of FIGS. 1 and 2.

Atomization of the fluid media/coating precursor can rely on an impinging gas stream as in the FIG. 1 embodiment. Alternatively, the atomization technique involving the rapid pressure release of a liquid media/coating precursor from near critical temperature and pressure conditions disclosed in the incorporated application Ser. No. 08/691,853 can be advantageously utilized. This technique involves heating the liquid media coating/precursor to a temperature within 50° C. of its critical temperature prior to directing it through a nozzle. As it exits the nozzle it is nebulized into a fine spray and directed through the reaction zone toward the substrate.

The coating precursor reacts and the liquid media vaporizes as they flow through the reaction zone to the deposition zone. In the deposition zone the coating precursor reaction product deposits a coating on a portion of the substrate surface.

The gases exhausting from the deposition zone leave the coating chamber through the ports 84, 87 through which the substrate enters and exits the chamber. These ports, in conjunction with the portion of the elongated substrate passing therethrough, define the barrier zone, and determine the area available for passage of the exhaust gases and, therefore, the velocity of the gases as they exit through the barrier zone. The dimensions of the ports are controlled so that the exiting gases are required to achieve the minimum velocity specified for the barrier zone. As in the preceding example, the inert gas fed through conduit 108 should be sufficient to assure the total gases fed the reaction zone result in sufficient gas passing through the ports 84, 87 that the required minimum velocity required in the barrier zone is achieved. The control of the gas velocity passing through the barrier zone, as defined by ports 84 and 87, establishes a controlled atmosphere zone which is generally coextensive with chamber 82.

The embodiment of FIG. 3 is particularly suitable for coating elongated substrates which can be fed semi-continuously through the coating chamber 82, such as metal or plastic sheet materials. Similar to the FIG. 1 embodiment, the process enables the coating of substrates which are larger than the controlled atmosphere zone, i.e. substrates having at least one dimension which is larger than the largest dimension of the controlled atmosphere zone.

The FIG. 3 embodiment can also be advantageously applied to coat substrates having multiple or irregular surfaces. In this case, good coatings can be achieved on all surfaces of the multiple surface substrate even if it is maintained in a static position in the controlled atmosphere zone provided by chamber 82 throughout the coating process. When two ports are not required to permit the substrate to be fed to and exit from the chamber, a single gas exit port could be substituted for the entry and exit ports 84 and 87. The cross-sectional area of that port must be controlled to assure the minimum gas velocity required in the barrier zone is achieved as the gas exits the chamber.

Figure 4:
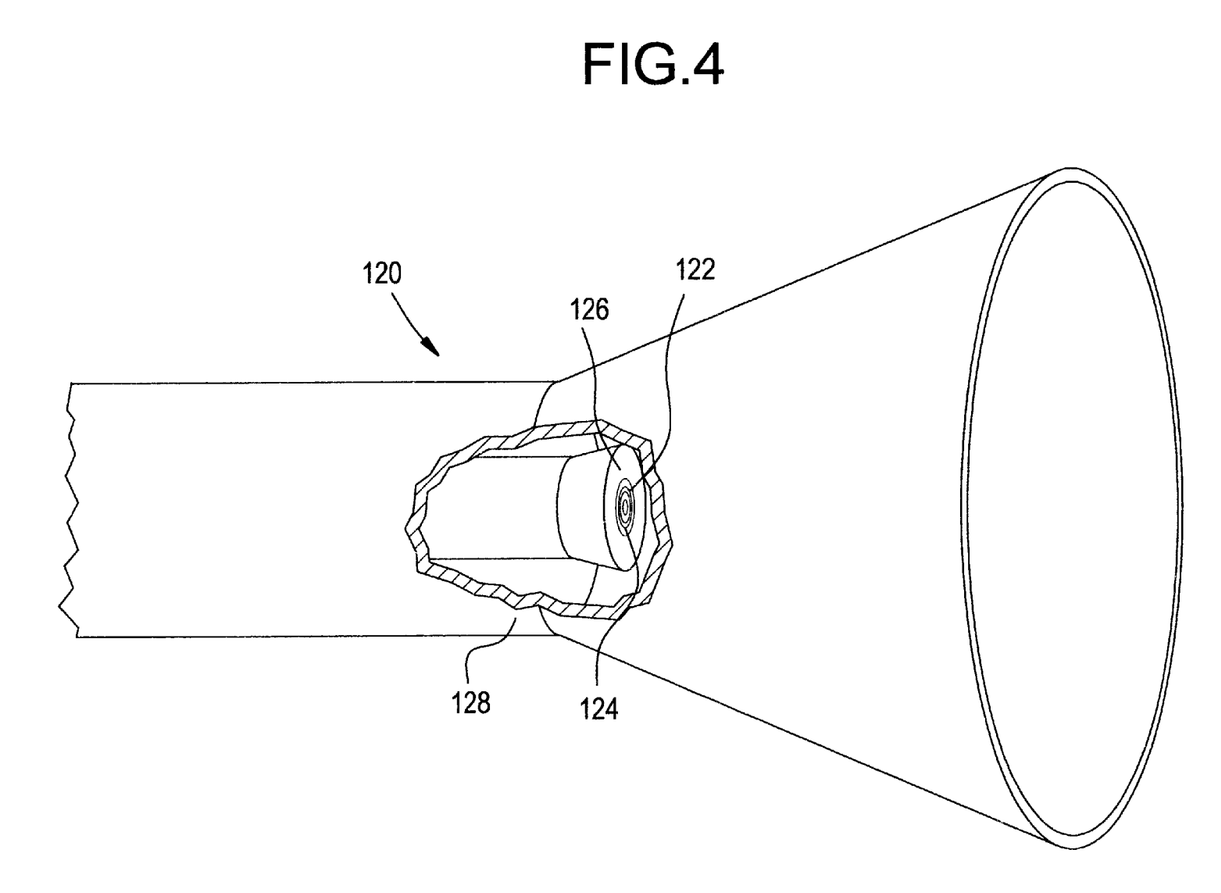
FIG. 4 is a perspective view, partially in section, of a coating head for use in yet another embodiment of the present invention.

The unique features of a further embodiment of the invention are schematically illustrated in FIG. 4. This embodiment relies on the gases leaving the deposition zone, within the controlled atmosphere zone, having to pass through a barrier zone comprising a curtain of inert gas which encloses the controlled atmosphere zone and is directed away from the deposition zone. The gases leaving the deposition zone are entrained in the curtain of inert gas. As the inert gas curtain travels around and away from the deposition zone it is maintained at the velocity required in the barrier zone until essentially all of the gases leaving the deposition zone have been entrained therein. The coating head 120 illustrated in FIG. 4 provides Controlled Atmosphere Combustion Chemical Vapor Deposition (CACCVD). The head includes a fine conduit, or capillary, 122 for feeding the coating precursor in a fluid media. The coating precursor/fluid media is heated to within 50° C. of its critical temperature and prior to discharging from the capillary is at a pressure in excess of its liquidus pressure. Surrounding conduit 122 are conduits 124 and 126 for feeding a fuel and an oxidizing agent. Concentric conduit 128 supplies the inert gas curtain. The end of conduit 128 and at least the exterior surface at the end of conduit 126 are flared outwardly in order to direct the discharging inert gas in a diverging conical shape. Conduit 128 may be either coextensive with the interior conduits 122, 124, 126, or it may extend past the end of the interior conduits.

In operation, the substrate is located generally in front of the coating precursor/fluid media discharging from conduit 122. The inert gas discharging from conduit 128 forms a flowing gas curtain in the shape of a diverging cone which isolates a controlled atmosphere zone which includes and extends around the reaction zone and the deposition zone formed at the surface of the substrate. The divergence of the flowing gas curtain is sufficient to direct the inert gas and gases entrained therein away from the deposition zone. As indicated previously, the velocity of gases in the curtain is maintained at the level required in the barrier zone until essentially all of the gases leaving the deposition zone have been entrained therein.

In this, as well as the other embodiments, the fluid media can be a combustible liquid organic solvent or gas such as an alkane, an alkene or an alcohol, or it can be an oxidant or exothermic material, such as nitrous oxide ($N_2O$), or it can comprise noncombustible or difficultly combustible materials such as water, carbon dioxide or ammonia.

The coating precursor material is an organic or a non-organic compound which is capable of reacting, including dissociation and ionizing reactions, to form a reaction product which is capable of depositing a coating on the substrate. Precursor materials which exothermically dissociate or otherwise exothermically react are particularly suitable since the exothermic energy evolved in the reaction zone decreases the energy input otherwise required. The coating precursor may be fed to the reaction zone as a liquid, a gas or, partially, as a finely divided solid. When fed as a gas, it may be entrained in a carrier gas. The carrier gas can be inert or it can also function as a fuel.

When the precursor is provided in a liquid media, as is preferred, up to 50% of the coating precursor material may be present as fine particles in the liquid media. However, it is preferred that the coating precursor material be fully dissolved in the liquid media, since such favors homogeneity and crystal growth in the deposited coating. The concentration of coating precursor in the liquid media typically is less than 0.1 M, and preferably is between 0.0005 M and 0.05 M, which is relatively dilute compared to concentrations of coating precursor materials required in those coating techniques which feed the coating precursor to the coating operation in a gaseous or vapor state. Moreover, the coating precursor material does not need to have a relatively high vapor pressure as do precursor materials of other coating techniques which are required to be fed in a gaseous or vapor state. Precursors having vapor pressures of less than 10 torr at 300° C. can be used. Accordingly, a relatively wide range of precursor materials may be used in this technique, many of which are substantially cheaper than the relatively volatile materials required by other coating techniques.

The deposited coating can be any inorganic or organic material that will deposit from a reactive precursor material. Metals, metal oxides, sulfates, phosphates, silica, silicates, phosphides, nitrides, borides and carbonates, carbides, other carbonaceous materials such as diamonds, and mixtures thereof are inorganic coatings which can be applied by the inventive system. Organic coatings, such as polymers, can also be deposited from reactive precursors, such as monomers, by those embodiments of the invention which avoid combustion temperatures in the reaction and deposition zones. The inventive process enables the controlled concurrent deposition of a mixture of a metallic component and an oxide component achieved by the more precise control of the reactive atmosphere enabled by the invention's controlled atmosphere zone.

The coating can be deposited to any desired thickness. The coating technique is particularly suitable for forming highly adherent coatings at thicknesses between 10 nanometers and 5 micrometers. Coatings are typically applied at rates between 0.1 and 500 milligrams/minute per coating head, preferably at rates between 0.5 and 2.0 milligrams/minute per coating head.

Examples of coatings produced by CACCVD include silicon dioxide coatings produced from a solution of tetraethoxysilane [$Si(OC_2H_5)_4$] in isopropanol and propane; platinum coatings produced from a solution of platinum-acetylacetonate [$Pt(CH_3COCHCOCH_3)_2$] in toluene and methanol; and nickel-doped $LaCrO_3$ coatings produced from solutions of lanthanum nitrate in ethanol, chromium nitrate in ethanol and nickel nitrate in ethanol. Examples of organic coatings which can be applied by this invention include fluorocarbon polymers, such as polytetrafloroethylene, and polyimides.

The substrates coated by the inventive technique can be virtually any solid material having a melting or decomposition point above 120° C., including metal, ceramic, polymer, glass and cellulosic materials. The inventive technique is particularly suitable for coating heat sensitive substrates since heating of the reaction and deposition zones does not require heating or energy input through the substrate. The substrate temperature is generally maintained below 600° C., preferably, it is maintained below 400° C. and, when required to avoid deleterious effects on the substrate or other components, the substrate can be maintained below 200° C. When coating the more temperature sensitive substrates, those embodiments of the invention which employ non-combustion energy input sources, such as heated fluids, radiant or microwave energy, are preferred. The substrate may be cooled by directing a flow of an inert cooling fluid, preferably a gas, at a surface which is remote from the deposition zone, such as the surface of the substrate which is opposite the surface exposed to the deposition zone. The inventive process is also particularly suited for coating substrates which, when heated, are capable of unwanted reactions with components in the atmosphere, such as substrates susceptible to oxidation. The lower temperatures to which the substrates are subjected and the controlled atmosphere surrounding the deposition zone both contribute to minimizing unwanted reactions of the substrate with atmospheric components.

While it is generally preferred to conduct the inventive coating procedure at essentially ambient, or atmospheric, pressure; it may at times be useful to control combustion flame temperatures or other parameters by controlling the combustion pressure. The combustion flame can be maintained at pressures as low as 10 torr. Generally, especially when energy sources other than a combustion flame are utilized, the greatest cost and production benefit is achieved by operating at ambient and higher pressures.

EXAMPLE 1

Nickel Coating on a Polyimide Substrate

Nickel films have been deposited on polyimide substrates in the apparatus illustrated in FIG. 1. A solution of 0.0688 M $Ni(NO_3)_2$ in 1.20 M $NH_4OH$ was fed through a 75 $\mu$m ID fused silica capillary (22) at a 0.25 sccm (standard cubic centimeter/minute) flow rate. Hydrogen was fed through atomizing conduit (38) at 1.20 lpm (standard liters/minute) and through conduit (44) at 756 sccm. Oxygen as fed through conduit (52) at 1.40 lpm. Argon was fed at 28.1 lpm through conduit (68), which had an interior diameter of 5/8 inch. The argon flow was reduced to permit manual ignition of the flame, following which it was returned to its initial setting. Once lit, no pilot or other ignition source was required to maintain ignition. The gas temperature approximately 1 mm above the deposition point was 600° C. The substrate was rastered 2 mm from the nozzle collar (64) at 20 inch/minute with 0.0625 inch steppings traversing an area of 4" by 4" twice, once with horizontal sweeps followed by once with vertical sweeps. The total time required for the rastering motion was 16 minutes. Nickel was deposited at an average thickness of approximately 0.1 micron.

EXAMPLE 2
Copper Coating on Aluminum and Glass Substrates

Copper was deposited from a 0.0350 M solution of copper(II)bis(2-ethylhexanoate) in anhydrous ethyl ether. The solution was sprayed, at 1.00 sccm, into a tube which was also fed with 40 lpm of a preheated 500° C. 10% $H_2$/Ar gas mixture. The injection was approximately 5 cm from the tube exit. The substrate was located normal to the gas flow approximately 2 mm from the tube exit. Metallic copper coatings were deposited on both aluminum and glass substrates by this method.

EXAMPLE 3
Platinum Coating on Polyimide Substrate

A platinum film has been deposited on polyimide in the apparatus shown in FIG. 1. A 5.3 mM $(NH_3)_2Pt(NO_2)_2$ solution in 1.20 M $NH_4OH$ was fed through capillary (22) at 0.25 sccm. Argon was fed through conduit (18) at 1.60 lpm. Hydrogen was fed through conduit (44) at 1.6 lpm. Oxygen was fed through conduit (52) at 800 sccm. Argon was fed through conduit (68) at 28.1 lpm. The gas temperature approximately 1 mm above the deposition point was 400° C. The substrate was rastered 2 mm from the nozzle collar (64) over an area of 6" by 6" three times, twice with horizontal sweeps followed by once with vertical sweeps. A platinum coating with over 6 lbs./inch peel strength was produced.

EXAMPLE 4
Nickel Coating on Polyimide Substrates

Nickel films have been deposited on polyimide substrates in the FIG. 1 apparatus. A solution of 2.00 g. $Ni(NO_3)_2$.$6H_2O$ in 25.0 g. $H_2O$ and 180 g. $NH_{3(L)}$ was fed from a 300 cc pressurized container through a 22 ga. stainless steel needle with a 20 $\mu$m ID fused silica capillary insert at the tip, at 0.25 sccm. Hydrogen was passed through conduits (38) and (44) at flow rates of 1.20 lpm and 756 sccm respectively. Oxygen was fed through conduit (52) at 1.20 lpm. Argon was fed through conduit (68) at 28.1 lpm. The gas temperature approximately 1 mm above the deposition point was 600° C. The substrate was rastered over an area of 4" by 4" twice at a distance of approximately 2 mm from the nozzle collar (64) for 16 minutes. A nickel coating having an average thickness of 0.1 micron was deposited.

EXAMPLE 5
Titanium Carbon Nitride Coating

Titanium carbon nitride (TiCN) can be deposited by injecting a mixture of $TiCl_4$, $NH_3$ and $CH_4$ into a preheated inert gas stream to cause decomposition of the precursors and deposition of TiCN on a provided substrate. The inert gas stream could be heated by coupling to an electromagnetic radiation source such as an infrared emitter or a microwave cavity. Alternatively, a plasma could be an energy source for decomposing the precursors.

EXAMPLE 6
Boron Nitride Coating

Boron nitride coatings can be deposited from the exothermic dissociation of a precursor such as aminoborane ($H_3NBH_3$). Aminoborane decomposes exothermically. A controlled flow of aminoborane could be provided in a deposition nozzle similar to those illustrated in FIGS. 1 and 3 to maintain a steady state reaction in the reaction zone resulting in deposits of boron nitride on provided substrates. The energy sources illustrated on the FIG. 3 deposition heads, or other non-combustion external energy sources, could be used to augment the energy released by the exothermic reaction and or provide better control of the deposition conditions.

EXAMPLE 7
Platinum/Silicon Dioxide Coatings on Polyimide or Copper

A layer of Pt/$SiO_2$ resistive material can be deposited by CACCVD on a polyimide or copper substrate from a solution containing:

1.23 g PtCOD [diphenyl-(1,5-cyclooctadiene)Platinum]

250 ml toluene 0.43 g TEOS (1.5 wt % Si) [tetraethoxysilane, $Si(OC_2H_5)_4$]

150 g propane

The solution is fed at a flow rate of 3 ml/min to a deposition head which provides a tip oxygen flow of 2900 ml/min and produces a deposition temperature of 500° C. for 18 minutes while traversing six passes over a five inch by six inch substrate.

The PtCOD and TEOS can be changed proportionally up to a concentrated solution containing 1.89 g PtCOD and 0.65 g TEOS. The proportion of TEOS can be changed to vary the weight % of $SiO_2$ in the resulting deposit.

EXAMPLE 8
Nickel Coating on a Polyimide Substrate

A nickel film has been deposited on a polyimide substrate from a solution of 0.760 g. $Ni(NO_3)_2.6H_2O$ in 50.0 g $H_2O$ and 150 g $NH_{3(L)}$ (300 cc pressurized container) in the FIG. 1 apparatus. The solution was fed through a 22 gauge stainless steel needle 22 with a 22 $\mu$m ID fused silica capillary insert at the tip at a flow rate of 0.50 sccm. Hydrogen was fed through the surrounding tube 38 at a rate of 1.40 lpm. Nothing was passed through tube 44. oxygen was fed through tube 52 at 1.20 lpm. Argon was fed through the outer tube 68 at 28.1 lpm. The argon was temporarily reduced to permit manual ignition of the flame. The gas temperature approximately 1 mm above the deposition was 550° C. The substrate was approximately 2 mm from the nozzle collar and was rastered in 0.0625 inch steps to traverse an area 3.5" by 3.5" once in 12 minutes, with horizontal sweeps at a rate of 20"/min.

Assuming ideal gas behavior and 200° C. for the argon, hydrogen, oxygen, water and ammonia and neglecting the volume contribution caused by combustion of the ammonia and the precursor material, the linear gas velocity flowing outwardly 2.54 cm from the center of the deposition zone is determined to be 701 ft/min. The linear flow velocity at the edge of the 6 inch diameter collar, with continuation of the above assumptions, is determined to be 234 ft/min.

EXAMPLE 9
Phosphate-doped Nickel Film on Polyimide Substrate

A phosphate doped nickel film has been deposited on a polyimide substrate from a solution of 2.50 g. $Ni(NO_3)_2.6H_2O$ and 0.30 $H_3PO_4$ in 400 ml 6M $NH_4OH$ in the FIG.

1 apparatus. The solution was fed through a 22 gauge stainless steel needle 22 with a 22 μm ID fused silica capillary insert at the tip at a flow rate of 0.50 sccm. Hydrogen was fed through the surrounding tube 38 at a rate of 1.20 lpm. Hydrogen was also passed through tube 44 at 756 sccm. Oxygen was fed through tube 52 at 1.40 lpm. Argon was fed through the outer tube 68 at 28.1 lpm. The argon was temporarily reduced to permit manual ignition of the flame. The gas temperature approximately 1 mm above the deposition was 500° C. The substrate was approximately 2 mm from the nozzle collar and was rastered with 0.0625 inch steps to traverse an area 3.5" by 3.5" once in 12 minutes, with horizontal sweeps at a rate of 20"/min. The deposited phosphate-doped layer had a linear resistance of 115 Ω/in. A comparable non-phosphate doped nickel layer demonstrated a linear resistance of 5 Ω/in.

EXAMPLE 10

$SrTiO_3$ Deposit on Nickel

The dielectric compound $SrTiO_3$ has been deposited on nickel by a CACCVD technique without forming NiO or detectable deposits of carbon on the substrate. The CCVD needle is provided in a jacket which provides inert or reducing gases around the flame. The jacketed nozzle is then located in a quartz tube which extends to the substrate. A solution of 0.82 g strontium 2-ethylhexanoate (1.5 wt. % Sr), 0.73 g titanium-di-i-propoxide-bis-acetylacetonate (0.94 wt. % Ti), 17 ml methanol and 100 g propane is fed through the needle at a rate of 2 ml/min. Oxygen is fed to the tip at 1300 ml/min., while hydrogen is provided at 1926 ml/min. A reducing gas formed of 0.5–10% hydrogen and balance argon flows around the flame from the jacket at a flow rate of 58 l/min. A deposition temperature between 800 and 1050° C., preferably approximately 950° C., is maintained over a deposition run of 10 to 15 minutes. As noted, a $SrTiO_3$ deposit is formed on the nickel substrate without forming NiO or detectable carbon deposits.

It is preferable in these depositions to use solvents with low carbon deposition potential, such as methanol. Similar depositions which substituted toluene for the methanol have resulted in carbon deposits.

EXAMPLE 11

Deposition of Nickel Oxide on Silica

A mixture comprising 0.6 g nickel nitrate hexahydrate in 3 g water mixed with 84 g of nitrous oxide (gas and liquid) can be fed to a CACCVD nozzle at near critical temperature (36.5°) and pressure (71.7 atm) conditions and at a 4 ml/min flow rate. Hydrogen at a flow rate of 4.3 l/min and oxygen at a 0.961 l/min flow rate are fed to the reaction zone resulting in a deposition temperature between 800° and 1000° C. and a nickel oxide film deposited on a silica substrate.

EXAMPLE 12

Deposition of Polymers on Substrates

Thin films of polymers including PTFE and polyimides may be prepared on silicon wafers as well as aluminum and copper substrates by the disclosed controlled atmosphere deposition technique utilizing non-combustion energy sources such as radiant or electromagnetic energy coupled to the process gas flow by infrared or microwave excitation. The deposit can be conducted at atmospheric pressure or higher while controlling the deposition and substrate temperatures at relatively low temperatures which readily enable polymerization of the injected monomers, while avoiding the higher temperatures associated with atmospheric pressure plasmas and which could decompose the monomers and/or damage the substrate materials. PTFE thin films could be produced from DuPont's Teflon AF dissolved in 3M's FC-77 fluroinert, or from a gas phase mixture of $C_2F_4$, $CHF_3$ and $C_2H_4$. Polyimide thin films may be produced from a solution of polyamic acid in dimethylacetamide and N-methylpyrrolidone.

Major advantages of the inventive technique are its joint capabilities (1) of being conducted at ambient, or atmospheric, pressure, (2) while avoiding the necessity of subjecting the substrate to relatively high temperatures and (3) avoiding the reaction of atmospheric gases with the heated substrate, (4) permitting the production of coatings which otherwise would be degraded by contact with atmospheric gases during the coating process, (5) permitting the use of inexpensive relatively non-volatile coating precursors, and (6) permitting the controlled concurrent deposition of both metallic and oxide components. While these advantages apply to each of the various embodiments of the invention, certain of the advantages are believed to be particularly unique with respect to certain individual embodiments of the invention. For instance, the capability of conducting atmospheric pressure depositions without subjecting the substrate to high temperatures is believed to be particularly unique with respect to embodiments which rely on such energy input sources as induction, RF and microwave energy devices. The production of relatively oxidation sensitive coatings is an enhanced property over previously described CCVD techniques.

The foregoing description is provided to enable workers in the art to make and practice the controlled atmosphere chemical vapor deposition apparatus and process. Individual embodiments described in the foregoing description are not intended to limit the scope of the invention other than as set forth in the following claims.

We claim:

1. A chemical vapor deposition process comprising:
   providing a flowing stream comprising a coating precursor in a fluid medium,
   directing said flowing stream in atomized or vaporized from through a controlled atmosphere zone comprising a reaction zone and a deposition zone,
   providing sufficient energy to said flowing stream to cause said coating precursor to react in said reaction zone forming a reacted coating precursor in a gas,
   providing a substrate having a surface,
   contacting a first portion of the surface of said substrate with said reacted coating precursor in said deposition zone to deposit a coating on said first portion of the substrate surface and form exhaust gases,
   causing said exhaust gases to flow through a barrier zone wherein the barrier zone is a clearance provided between the substrate and a collar extending outward from the end of a conduit adjacent the deposition zone,
   causing said exhaust gases to flow though said barrier zone with sufficient velocity to prevent the flow of gases from ambient atmosphere through said barrier zone and into said controlled atmosphere zone.

2. The process of claim 1, wherein said barrier zone is created by restricting fluid communication between said controlled atmosphere zone and the ambient atmosphere to a small clearance extending around the deposition zone.

3. The process of claim 1, further comprising providing a curtain of an inert gas flowing about said controlled atmosphere zone.

4. The process of claim 1, wherein said exhaust gases reach a velocity of at least 50 feet per minute as they flow through said barrier zone.

5. The process of claim 1, wherein said providing sufficient energy comprises mixing a preheated gas with said flowing stream in said reaction zone.

6. The process of claim 1, wherein said exhaust gases reach a velocity of at least 100 feet per minute as they pass through said barrier zone.

7. The process of claim 1, wherein at least a portion of said energy added to said flowing stream is provided by the decomposition of an exothermically decomposable material.

8. The process of claim 1, wherein said substrate is maintained at a temperature below 600° C.

9. The process of claim 1, further comprising causing said deposition zone to traverse the surface of said substrate.

10. The process of claim 9, wherein said surface has at least one dimension larger than the largest dimension of said controlled atmosphere zone.

11. The process of claim 1, wherein said energy is provided by combusting fuel and an oxidizing agent in said reaction zone.

12. The process of claim 11, wherein said fuel and said oxidizing agent are fed to said reaction zone in separate coaxial conduits.

13. The process of claim 11, wherein an excess of said fuel over that required to fully combust the oxidizing agent is provided in said reaction zone.

14. The process of claim 11, wherein the pressure in said deposition zone is at least ambient pressure.

15. The process of claim 11, wherein the substrate is maintained at a temperature below 600° C.

16. The process of claim 11, wherein the combustion products produced from said fuel and said oxidizing agent are combined with said flowing stream prior to passing through said barrier zone.

17. The process of claim 11, wherein said barrier zone is created by restricting fluid communication between said controlled atmosphere zone and the ambient atmosphere to a small clearance extending around the deposition zone.

18. The process of claim 11, wherein said coating precursor has a vapor pressure of less than 10 torr at 300° C.

19. The process of claim 11, further comprising
providing a flowing stream which has a critical temperature and a liquidus pressure,
further providing said flowing stream at a temperature within 50° C. of said critical temperature and at a pressure above said liquidus pressure, and
rapidly reducing such pressure to cause said atomization of said flowing stream.

20. The process of claim 11, wherein said fluid medium comprises nitrous oxide.

21. The process of claim 1, wherein the pressure in said deposition zone is at least ambient pressure.

22. The process of claim 21, wherein said barrier zone is created by restricting fluid communication between said controlled atmosphere zone and the ambient atmosphere to a small clearance extending around the deposition zone.

23. The process of claim 22, wherein a second portion of the surface of said substrate extends outwardly away from said deposition zone, and
said clearance is established adjacent to said second portion of said surface of said substrate.

24. The process of claim 23, wherein said small clearance extends less than 10 millimeters from said second portion of the surface of said substrate.

25. The process of claim 21, further comprising providing a curtain of inert gas flowing around said controlled atmosphere zone.

26. The process of claim 21, wherein said exhaust gases reach a velocity of at least 50 feet per minute as they flow through said barrier zone.

27. The process of claim 25, wherein said inert gas is combined with said flowing stream prior to passing through said barrier zone.

28. The process of claim 21, wherein said flowing stream is atomized by contacting it with a pressurized gas.

29. The process of claim 28, wherein said flowing stream is fed into said reaction zone from a first conduit, and
said pressurized gas is fed in a second conduit which is coaxial with said first conduit.

30. The process of claim 28, wherein said pressurized gas is a fuel.

31. The process of claim 21, wherein a cooling media is applied to a surface of the substrate which is not within said deposition zone.

32. The process of claim 21, wherein the substrate is maintained at a temperature below 600° C.

33. The process of claim 21, wherein at least a portion of said energy is added to said flowing stream by passing said flowing stream through a heated conduit.

34. The process of claim 21, wherein at least a portion of said energy added to said flowing stream is provided by at least one of radiation heating, induction heating, radio frequency heating, microwave heating or photonic heating.

35. The process of claim 21, wherein said coating precursor is dissolved in a liquid fluid medium.

36. The process of claim 35, wherein the concentration of said coating precursor in said liquid medium is less than 0.1 molar.

37. The process of claim 21, wherein said coating precursor has a vapor pressure of less than 10 torr at 300° C.

38. The process of claim 21, wherein said fluid medium comprises nitrous oxide.

39. The process of claim 1, further comprising
providing a flowing stream which has a critical temperature and a liquidus temperature,
further providing said flowing stream at a temperature within 50° C. of said critical temperature and at a pressure above said liquidus pressure, and
rapidly reducing such pressure to cause said atomization of said flowing stream.

40. The process of claim 21, wherein said coating comprises an organic compound.

41. The process of claim 21, wherein said coating comprises a polymer.

42. The process of claim 41, wherein said coating comprises at least one polymer selected from the group consisting of polymeric fluorocarbons and polyimides.

43. The process of claim 21, wherein said coating comprises a nitride, boride, silicide, phosphide or sulfide compound.

44. The process of claim 21, wherein said coating comprises a carbide compound.

45. The process of claim 21, wherein said substrate is a plastic and said coating is a metal.

46. The process of claim 45, wherein said substrate is a polyimide and said coating is nickel.

47. The process of claim 21, wherein said coating is deposited to a thickness between 10 nanometers and 5 micrometers.

48. The process of claim 21, wherein at least a portion of said energy is provided by electrical resistance heating.

49. The process of claim 1, wherein the velocity of said gases is maintained at at least 50 feet per minute until the temperature of the substrate directly adjacent said gases is below the temperature at which components in the ambient atmosphere can chemically react with the substrate or any deposit thereon.

50. The method according to claim 1 wherein said deposited coating is copper.

51. The method according to claim 50 wherein said substrate is a metal.

52. The method according to claim 50 wherein said substrate is a ceramic.

53. The method according to claim 1 wherein said deposited coating is nickel.

54. The method according to claim 1 wherein said deposited coating is platinum.

55. The method according to claim 1 wherein said deposited coating is selected from the group consisting of metals, metal oxides, sulfates, phosphates, silica, silicates, phosphides, nitrides, borides, carbonates, carbides, and carbonaceous materials.

56. The method according to claim 1 wherein said deposited coating is phosphate-doped nickel.

57. The method according to claim 1 wherein said deposited coating is $SrTiO_3$.

58. The method according to claim 1 wherein said deposited coating is nickel oxide.

59. The method according to claim 1 wherein said deposited coating is titanium carbon nitride.

60. The method according to claim 1 wherein said substrate is a polymeric material.

61. The method according to claim 1 wherein said substrate is polyimide.

62. The method according to claim 1 wherein said substrate is polytetrafluoroethylene.

63. The method according to claim 1 wherein said substrate is a ceramic.

64. The method according to claim 1 wherein said substrate is glass.

65. The method according to claim 1 wherein said substrate is a metal.

66. The method according to claim 1 wherein said substrate is nickel-containing.

* * * * *